(12) United States Patent
Blume et al.

(10) Patent No.: US 6,964,489 B2
(45) Date of Patent: Nov. 15, 2005

(54) DEVICE FOR PRODUCING AN IMAGE

(75) Inventors: Heinrich-Jochen Blume, Darmstadt (DE); Kai Hohmann, Bebra (DE); Heinrich Noll, Gross-Umstadt (DE); Thomas Brohm, Eppertshausen (DE); Ralf Mayer, Bolanden (DE)

(73) Assignee: Siemens Aktiengesellschaft, München (DE)

( * ) Notice: Subject to any disclaimer, the term of this patent is extended or adjusted under 35 U.S.C. 154(b) by 190 days.

(21) Appl. No.: 10/271,621

(22) Filed: Oct. 15, 2002

(65) Prior Publication Data

US 2004/0062040 A1 Apr. 1, 2004

(30) Foreign Application Priority Data

Sep. 27, 2002 (DE) .......................................... 102 45 580

(51) Int. Cl.[7] .............................................. G01D 11/28
(52) U.S. Cl. ........................... 362/27; 362/97; 362/231; 362/800; 349/61
(58) Field of Search .............................. 362/27, 31, 29, 362/97, 231, 800; 349/11, 61, 62

(56) References Cited

U.S. PATENT DOCUMENTS

| | | | | |
|---|---|---|---|---|
| 5,808,800 A | * | 9/1998 | Handschy et al. | ............ 349/11 |
| 6,642,975 B2 | * | 11/2003 | Chino et al. | .................. 349/62 |
| 2001/0035922 A1 | | 11/2001 | Park et al. | |

FOREIGN PATENT DOCUMENTS

| | | |
|---|---|---|
| EP | 0838715 | 4/1998 |
| EP | 1164566 | 12/2001 |

OTHER PUBLICATIONS

Patent Abstracts of Japan, vol. 1999, No. 13, Nov. 30, 1999, & JP 11 231316 A (Ricoh Co Ltd), Aug. 27, 1999.

* cited by examiner

Primary Examiner—Stephen F Husar
(74) Attorney, Agent, or Firm—Martin A. Farber

(57) ABSTRACT

In a device for producing an image with a high light intensity by an image reproduction apparatus (9) which contains light valves, a light source comprising a light-emitting diode matrix (1, 2, 3) is provided for background lighting of the image reproduction apparatus (9). An optical device (5, 8, 10) for focussing and scattering the light which is produced by the light-emitting diode (1) is arranged between the light source (1, 2, 3) and the image reproduction apparatus (9).

19 Claims, 3 Drawing Sheets

DEVICE FOR PRODUCING AN IMAGE

The invention relates to a device for producing an image, having an image reproduction apparatus which contains light valves.

FIELD AND BACKGROUND OF THE INVENTION

In order to provide vehicle drivers with information without them having to look away from the road to be driven on or away from the air space to be flown in, so-called heads-up displays have become known, which are used to overlay an image, which represents the information, on the windshield of a vehicle. In order that this is visible even when the ambient light is bright, the image has to have a high light intensity for this purpose.

SUMMARY OF THE INVENTION

The object of the invention is thus to produce an image with a high light intensity using devices which are suitable for operation in a vehicle, that is to say in particular which are physically small and whose weight is low, and in which the power losses, which are emitted as heat, are as low as possible.

According to the invention, this object is achieved in that a light source comprising a light-emitting diode matrix is provided for background lighting of the image reproduction apparatus, and by the fact that an optical device for focussing and scattering the light produced by the light-emitting diodes is arranged between the light source and the image reproduction apparatus.

The invention allows a compact device for producing high-resolution images with high light intensity and uniform light intensity distribution over the entire image area. In this case, the device for focussing and scattering ensures that the light which is produced by the light-emitting diodes is concentrated onto the surface of the image reproduction apparatus, without any disturbing imaging of the individual light-emitting diodes. One preferred field of application for the device according to the invention is graphical heads-up displays for vehicle applications.

With the device according to the invention, it has been found to be advantageous for each matrix point to be formed by a number of light-emitting diodes.

Although the device according to the invention is in principle also suitable for monochromatic displays, a colored display represents a preferred field of application, with provision in particular being made for the light-emitting diode for each matrix point to emit differently colored light, in particular with four light-emitting diodes forming one matrix point.

A particularly bright image impression in the sense of the sensitivity curve of the human eye can be achieved by providing two green light-emitting diodes, one blue light-emitting diode and one red light-emitting diode for each matrix point. In this case, the color space including the color-may be displayed such that it is largely white.

If this is unnecessary or if there is a desire to restrict the colors to be displayed in favor of selected colours being displayed brighter, the light-emitting diodes may also be selected differently. In order to display traffic-light colors, for example red orange and green, two green light-emitting diodes and two red light-emitting diodes may be provided for each matrix point.

One advantageous refinement of the device according to the invention allows the light intensity to be increased further by surrounding each of the matrix points by a reflector.

A development of the device according to the invention allows colored images to be displayed by the light valves each having associated color filters with different spectral passbands, with the passbands of the color filters being matched to the spectral light distribution of the light-emitting diodes.

This refinement can be embodied such that at least one green filter has a passband which also detects parts of the spectral bands of red and green light-emitting diodes. This results in a further increase in the light intensity—but at the expense of the maximum color saturation which can be displayed, although this has no disturbing effect on the majority of applications.

Another development of the device according to the invention contributes to a uniform light distribution in that the device for focussing and scattering comprises a reflector which is in the form of a grid and forms a light channel for each matrix point, the walls of which light channel are reflective. In this case, provision is preferably made for the cross section of each light channel to widen in the direction of the image reproduction apparatus. This development can be configured such that a further reflector, in the form of a frame, is provided between the first-mentioned reflector.

In order to improve the uniform light intensity distribution further, is possible in the device according to the invention to provide for the device for focussing and scattering furthermore to comprise a scatter disc which is arranged between the reflector, which is in the form of a grid, and the image reproduction apparatus, with a distance being provided between the reflector, which is in the form of a grid, and the scatter disc.

Scatter discs with integrated scattering particles undesirably attenuate the light beam, although this effect can be reduced by the scatter disc being a surface-structured diffuser. Provision is preferably made in this case for the surface to be structured such that the scatter angle in one direction is greater than in the other direction, thus resulting in elliptical scatter. In the case of an elongated display, the major axis of the scatter angle can be arranged in the direction of the greater extent of the display.

When using the device according to the invention as a heads-up display, it is impossible to avoid light in the opposite direction from the light emitted by the device according to the invention from falling on the image reproduction apparatus, and from being reflected there. In order to prevent this reflected light from being reflected together with the light that represents the image in the direction of the viewer, one development of the device according to the invention provides for the image reproduction apparatus to be further away from the light source on one side of the device than on the other side. This oblique position of the image reproduction apparatus avoids the disturbing reflection while at the same time ensuring that the light from the light source has a linear path in the direction of the viewer.

The use of suitable plastics allows the device according to the invention to be manufactured at low cost. By way or example, the reflector which is in the form of a grid may be injection molded from plastic.

Another advantageous refinement contributes to improved utilization of the light produced by the light-emitting diodes by arranging a polarization filter between the device for focussing and scattering and the light source, which polarization filter passes light with one predetermined polarization direction, and reflects light with other polarization directions.

A compact and optically effective device according to the invention is achieved in that the reproduction apparatus, the light source and the device for focussing and scattering essentially occupy the same area.

Another embodiment of the invention is for the image reproduction apparatus to be a low-temperature polysilicon TFT display. This results in a larger aperture and hence greater transmission and display brightness than a standard TFT display.

A number of advantages of the device according to the invention will also be described in the following text. For example, graphical color images can be displayed with an adequate light intensity in a heads-up display by trimming between the RGT light source and the color display. A uniform color and light intensity distribution of the background lighting on the surface of the liquid crystal display is achieved by the interaction with the reflector and lens. The contrast maximum of the liquid crystal display is rotated into the viewing direction by virtue of the slight inclined position of the display with respect to the light source.

Configurable image contents can be displayed in color in the liquid crystal color display. The image contents may thus be matched to the driving situation. The physical space for the entire image production device for the example used in practice is only a few cubic centimeters. The respective color space to be displayed can be influenced by choosing the colors of the light-emitting diodes and of the associated display. For example, a red-green light-emitting diode raster may be chosen instead of an RGB light-emitting diode raster and, in a corresponding way, the blue filter elements in the liquid crystal display may be replaced by green filter elements. This results in a restricted color space, with the light intensity once again being considerably increased.

BRIEF DESCRIPTION OF THE DRAWINGS

The invention allows numerous embodiments. A number of these will be described in the following text and are illustrated schematically in a number of figures in the drawing, in which.

DETAILED DESCRIPTION OF THE PREFERRED EMBODIMENT

Figure 1:
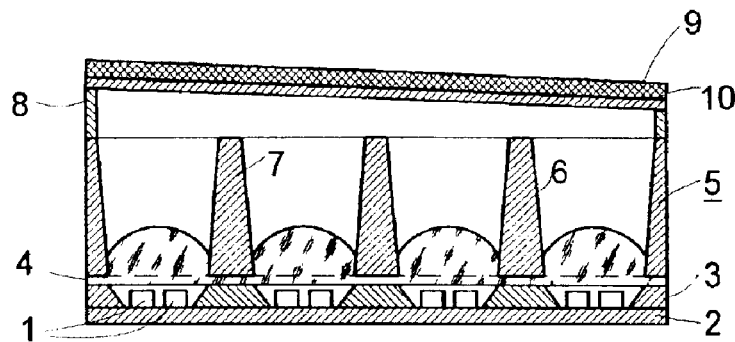
FIG. 1 shows a section through one exemplary embodiment.
Figure 2:
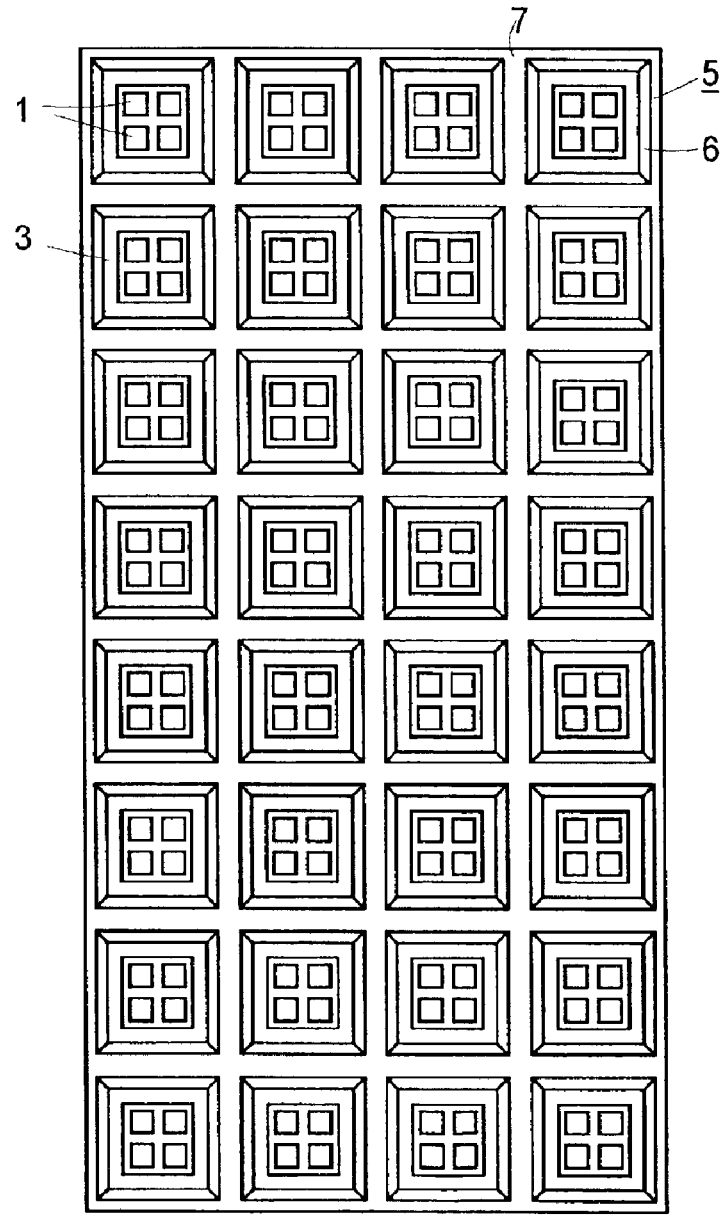
FIG. 2 shows a plan view of the reflector, which is in the form of a grid, in the exemplary embodiment shown in FIG. 1.

In the exemplary embodiment shown in FIGS. 1 and 2, a raster of 4×8 groups each having four light-emitting diodes 1 is provided as the light source, and the light-emitting diodes 1 are mounted on a mount 2. Webs 3 are located between the groups, and the oblique surface of the webs 3 is used as a reflector.

A lens raster 4 is located above the light source 1, 2, 3, connected to a reflector 5 which is in the form of a grid.

The webs 3, the lens raster 4 and the oblique surfaces 6 of the reflector 5 which is in the form of a grid provide a uniform light distribution. In order to prevent shadowing from the webs 7 of the reflector 5, a frame 8 is provided, which produces a separation between the reflector 5 and the liquid crystal display 9. A scatter disc 10 is located underneath the liquid crystal display 9, in order to further improve the uniformity of the background lighting of the liquid crystal display 9.

The frame 8 results in the liquid crystal display being positioned obliquely, so that light which is incident from above is not reflected in the same direction in which the light also leaves the liquid crystal display, thus reaching the viewer.

FIG. 2 shows the device shown in FIG. 1 with the liquid crystal display 9 removed and with the scatter disc 10 removed. The light-emitting diodes 1 can be seen through the lens raster 4 in the illustration shown in FIG. 2. However, for the sake of simplicity, corresponding distortion of the light-emitting diodes 1 is not shown.

Figure 3:
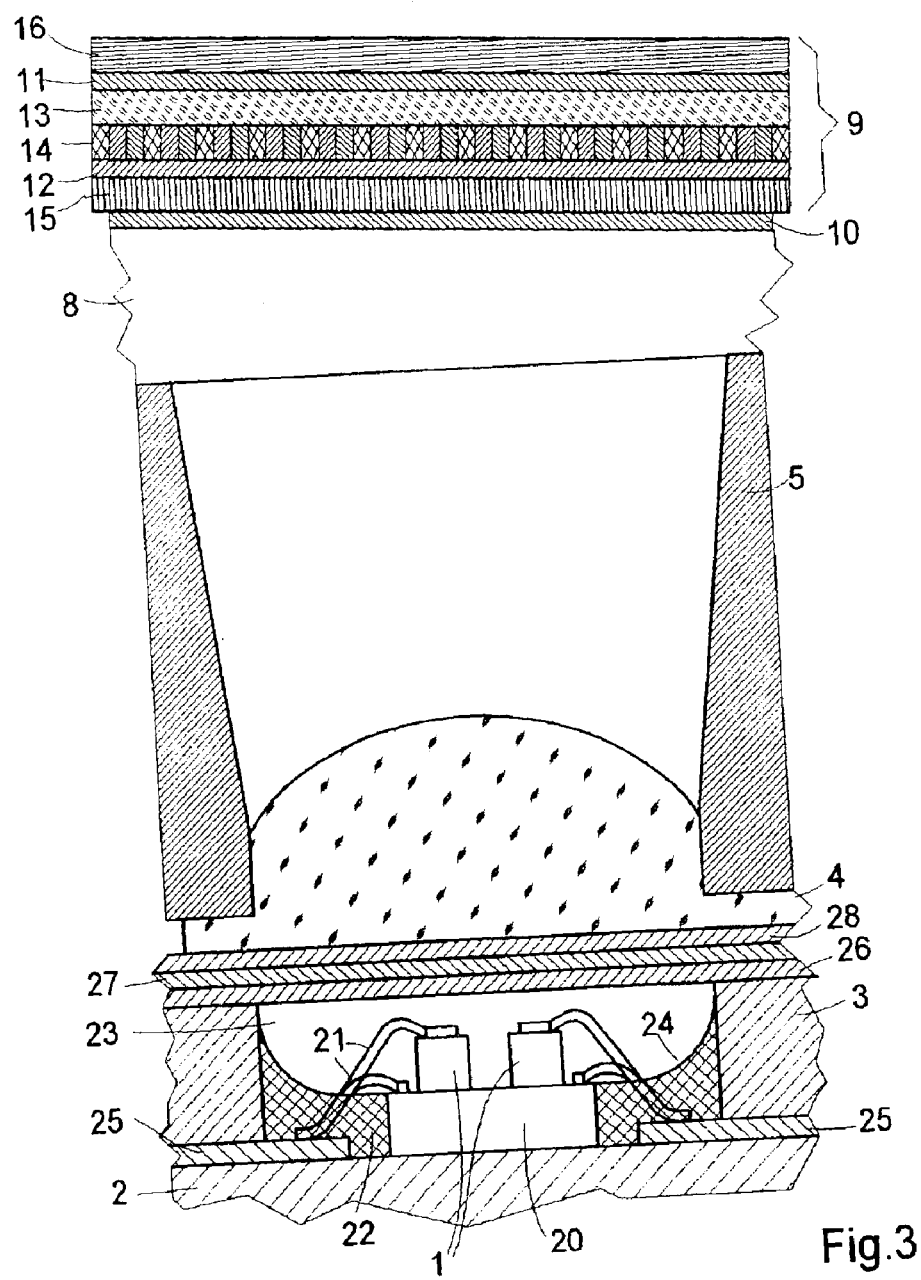
FIG. 3 shows an enlarged illustration of a detail from FIG. 1, in order to explain various details.

FIG. 3 essentially shows an enlargement of a detail from FIG. 1, and will be used to explain details of the liquid crystal display and of the light source. Between two glass plates 11, 12, the liquid crystal display 9 has a liquid crystal 13 and a color filter 14. The latter comprises a raster of three color points of different colors, as is indicated by different shading in FIG. 3. Control electrodes, which are not shown but which each form a light valve together with the liquid crystal, are provided such that they correlate with the raster of the color filter. Polarizers 15, 16 with mutually perpendicular polarization planes are located outside the glass plates 11, 12.

The light source, which will be described briefly in conjunction with FIG. 1, is likewise illustrated in more detail in FIG. 3.

Four light-emitting diodes 1 are arranged in a raised position on a submount 20 in the center of a hole which is formed by webs 3. The light-emitting diodes are connected via bonding wires 21 to lines 25, which are illustrated only schematically by shading of the area that they occupy. In one of the preferred embodiments, one of the light-emitting diodes is red, two are green and the fourth is blue. In this arrangement, the light is mixed to form white. The space between the submount 20 and the webs 3 is filled with a white encapsulation compound 22, whose surface 24 acts as a reflector for the light which is emitted at the sides from the light-emitting diodes 1. A transparent encapsulation compound 23 prevents the formation of a cavity.

The connection between the light source 1, 2, 3 and the lens raster 4 in the exemplary embodiment illustrated in FIG. 3 is provided via a layer 26 composed of silicone gel, a PCF layer 27 and a suitable adhesive 28.

The PCF layer 27 has the effect that, of the light which is produced by means of the light-emitting diodes, the only light which is allowed to be emitted is that which is polarized in the direction of the lower polarizer 15, so that no light is lost by the polarization in the PCF layer 27. Light with other polarizations is reflected by the PCF layer 27 and is then remitted from the surface 24. The component with the appropriate polarization then once again additionally passes through the PCF layer 27, so that, overall, the PCF layer contributes to increasing the brightness.

Figure 4:
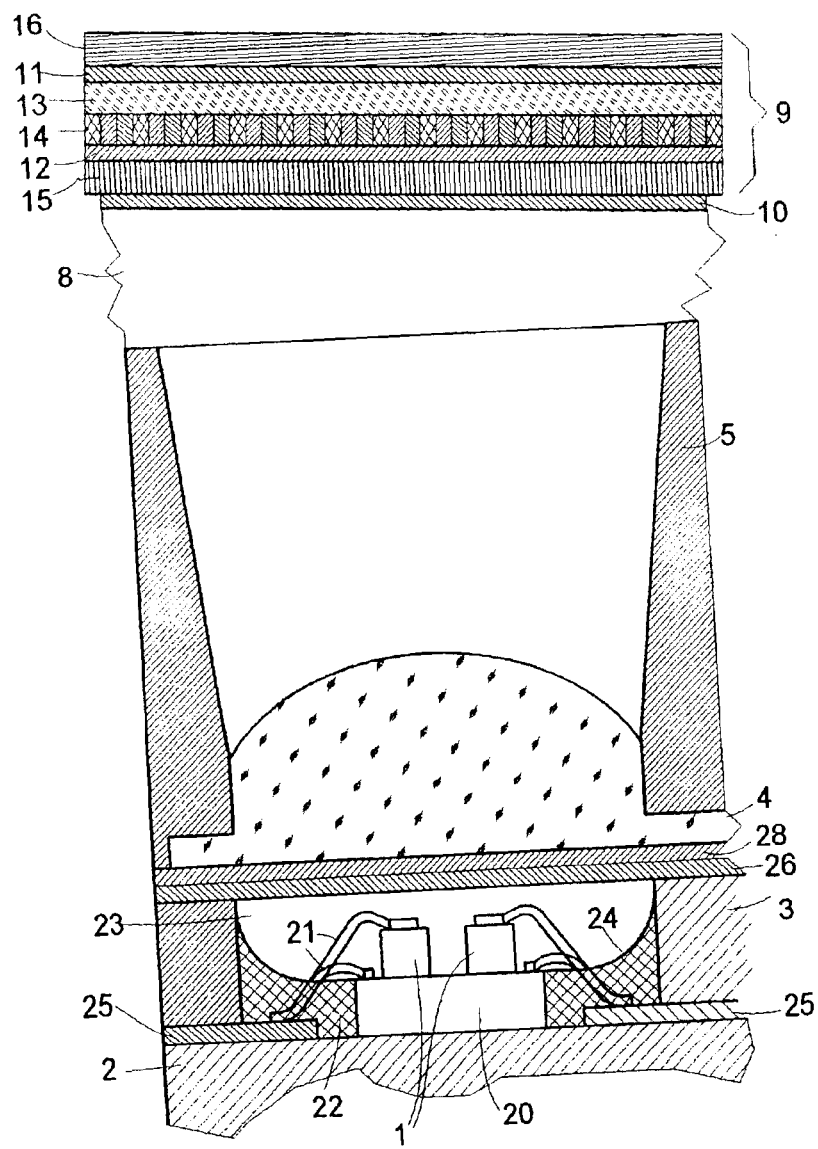
FIG. 4 shows an enlarged illustration of a detail of another exemplary embodiment.

FIG. 4 shows an exemplary embodiment without a PCF layer. In addition, FIG. 4 shows the illustrated detail of the edge of the device.

Figure 5:
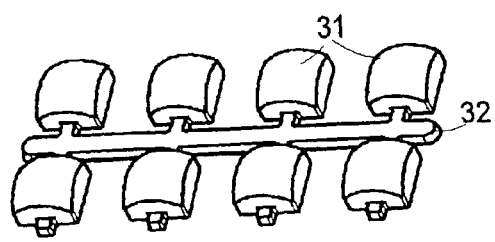
FIG. 5 shows a part of the lens raster.

FIG. 5 shows a lens raster 31 with eight lenses, which are interconnected by means of webs 32. Four of the lens rasters which are illustrated in FIG. 5 are arranged alongside one another in the exemplary embodiment shown in FIGS. 3 and 4.

I claim:

1. A device for producing an image with an image reproduction apparatus (9) which contains light valves, comprising: a light source comprising a light-emitting diode matrix (1, 2, 3) of light-emitting diodes provided for background lighting of the image reproduction apparatus (9), and an optical device for focussing and scattering light produced by the light-emitting diodes that is arranged between the light source and the image reproduction apparatus; wherein one matrix point is in each case formed by a number of the light-emitting diodes (1); four light-emitting diodes (1) form one matrix point; and wherein two green light-emitting diodes and two red light-emitting diodes are provided for each matrix point.

2. A device for producing an image with an image reproduction apparatus (9) which contains light valves, comprising: a light source comprising a light-emitting diode matrix (1, 2, 3) of light-emitting diodes provided for background lighting of the image reproduction apparatus (9), and an optical device for focussing and scattering light produced by the light-emitting diodes that is arranged between the light source and the image reproduction apparatus; and wherein the light valves have associated color filters (14) with different spectral passbands, with the passbands of the colored filters (14) being matched to spectral light distribution of the light-emitting diodes (1).

3. The device as claimed in claim 2, wherein one matrix point is in each case formed by a number of the light-emitting diodes (1).

4. The device as claimed in claim 3, wherein the light-emitting diodes (1) of each matrix point emit different colored light.

5. The device as claimed in claim 3, wherein four light-emitting diodes (1) form one matrix point.

6. The device as claimed in claim 5, wherein two green light-emitting diodes (1), one blue light-emitting diode and one red light-emitting diode (1) are provided for each matrix point.

7. The device as claimed in claim 3, wherein the matrix points are surrounded by in each case one reflector (3, 24).

8. The device as claimed in claim 2, wherein at least one green filter has a passband which also detects parts of the spectral bands of red and green light-emitting diodes (1).

9. A device for producing an image with an image reproduction apparatus (9) which contains light valves, comprising: a light source comprising a light-emitting diode matrix (1, 2, 3) of light-emitting diodes provided for background lighting of the image reproduction apparatus (9), and an optical device for focussing and scattering light produced by the light-emitting diodes that is arranged between the light source and the image reproduction apparatus; wherein one matrix point is in each case formed by a number of the light-emitting diodes (1); and wherein the device for focussing and scattering comprises a reflector (5) which is in a form of a grid and forms a light channel for each matrix point, and walls (6) of the light channel are reflective.

10. The device as claimed in claim 9, wherein the device for focussing and scattering furthermore comprises a scatter disc, which is arranged between the reflector (5), which is in the form of the grid, and the image reproduction apparatus (9), with a distance being provided between the reflector (5) and the scatter disc (10).

11. The device as claimed in claim 10, wherein the scatter disc (10) is a surface-structured diffuser.

12. The device as claimed in claim 9, wherein the reflector (5) is injection molded from plastic.

13. A device for producing an image with an image reproduction apparatus (9) which contains light valves, comprising: a light source comprising a light-emitting diode matrix (1, 2, 3) of light-emitting diodes provided for background lighting of the image reproduction apparatus (9), and an optical device for focussing and scattering light produced by the light-emitting diodes that is arranged between the light source and the image reproduction apparatus; wherein one matrix point is in each case formed by a number of the light-emitting diodes (1); the device for focussing and scattering comprises a reflector (5) which is in a form of a grid and forms a light channel for each matrix point, and walls (6) of the light channel are reflective; and the cross section of each light channel widens in direction of the image reproduction apparatus (9).

14. A device for producing a image with an image reproduction apparatus (9) which contains light valves, comprising: a light source comprising a light-emitting diode matrix (1, 2, 3) of light-emitting diodes provided for background lighting of the image reproduction apparatus (9), and an optical device for focussing and scattering light produced by the light-emitting diodes that is arranged between the light source and the image reproduction apparatus; wherein one matrix point is in each case formed by a number of the light-emitting diodes (1); the device for focussing and scattering comprises a reflector (5) which is in a form of a grid and forms a light channel for each matrix point, and walls (6) of the light channel are reflective; and a further reflector (8), in a form of a frame, is provided between the reflector (5).

15. A device for producing an image with an image reproduction apparatus (9) which contains light valves, comprising: a light source comprising a light-emitting diode matrix (1, 2, 3) of light-emitting diodes provided for background lighting of the image reproduction apparatus (9), and an optical device for focussing and scattering light produced by the light-emitting diodes that is arranged between the light source and the image reproduction apparatus; wherein one matrix point is in each case formed by a number of the light-emitting diodes (1); the device for focussing and scattering comprises a reflector (5) which is in a form of a grid and forms a light channel for each matrix point, and walls (6) of the light channel are reflective; wherein the device for focussing and scattering furthermore comprises a scatter disc, which is arranged between the reflector (5), which is in the form of the grid, and the image reproduction apparatus (9), with a distance being provided between the reflector (5) and the scatter disc (10); the scatter disc (10) is a surface-structured diffuser; and wherein the surface is structured such that a scatter angle in one direction is greater than in another direction, thus resulting in elliptical scatter.

16. A device for producing an image with an image reproduction apparatus (9) which contains light valves, comprising: a light source comprising a light-emitting diode matrix (1, 2, 3) of light-emitting diodes provided for background lighting of the image reproduction apparatus (9), and an optical device for focussing and scattering light produced by the light-emitting diodes that as arranged between the light source and the image reproduction apparatus; wherein one matrix point is in each case formed by a number of the light-emitting diodes (1); the device for focussing and scattering comprises a reflector (5) which is in a form of a grid and forms a light channel for each matrix point, and walls (6) of the light channel are reflective; the image reproduction apparatus (9) is further away from the light source (1, 2, 3) on one side of the device than on the other side; and wherein the image reproduction apparatus has an oblige position such that, disturbing reflection in the direction of the viewer is avoided.

17. A device for producing an image with an image reproduction apparatus (9) which contains light valves, comprising: a light source comprising a light-emitting diode matrix (1, 2, 3) of light-emitting diodes provided for background lighting of the image reproduction apparatus (9), and an optical device for focussing and scattering light produced by the light-emitting diodes that is arranged between the light source and the image reproduction apparatus; and further comprising a polarization filter (27) is arranged between the device for focussing and scattering (4, 5, 10) and the light source (1, 2, 3), and said polarization filter passes light in one predetermined polarization direction, and reflects light in other polarization directions.

18. The device as claimed in claim 17, wherein the reproduction apparatus, the light source (1, 2, 3) and the device for focussing and scattering (4, 5, 10) essentially occupy a same area.

19. The device as claimed in claim 17, wherein the image reproduction apparatus (9) is a low-temperature polysilicon TFT display.

\* \* \* \* \*